United States Patent [19]
Mitani

[11] Patent Number: 5,100,822
[45] Date of Patent: Mar. 31, 1992

[54] SEMICONDUCTOR INTEGRATED CIRCUIT DEVICE AND METHOD OF PRODUCTION THEREOF

[75] Inventor: Shinichiro Mitani, Tokyo, Japan
[73] Assignee: Hitachi, Ltd., Tokyo, Japan
[21] Appl. No.: 606,568
[22] Filed: Oct. 31, 1990

Related U.S. Application Data

[63] Continuation of Ser. No. 709,670, Mar. 8, 1985, abandoned.

[30] Foreign Application Priority Data

Apr. 11, 1984 [JP] Japan .................................. 59-70859

[51] Int. Cl.$^5$ .......................................... H01L 27/108
[52] U.S. Cl. .......................................... 437/48; 437/52; 437/59; 437/60; 357/23.6; 148/DIG. 109
[58] Field of Search ....................... 437/51, 52, 59, 60, 437/228, 235, 238, 239, 919, 48; 357/23.6; 148/DIG. 14, DIG. 109

[56] References Cited

U.S. PATENT DOCUMENTS 4,353,086 10/1982 Jaccodine et al. .

FOREIGN PATENT DOCUMENTS 0137245 8/1983 Japan .
0202560 11/1983 Japan .................................. 156/644

Primary Examiner—Olik Chaudhuri
Assistant Examiner—M. Wilczewski
Attorney, Agent, or Firm—Antonelli, Terry, Stout & Kraus

[57] ABSTRACT

Disclosed is a semiconductor device having grooves extending from the semiconductor substrate surface into the interior of the substrate, the grooves having an insulating layer, such as an oxide layer, on the surfaces thereof, with the insulating layer being covered with a conductive layer. The corners of the grooves are rounded-off, whereby the electrostatic destruction voltage of the insulating film is increased as compared with using grooves without having rounded-off corners. Also disclosed is a method of making such device, including steps of forming an initial insulating film on the surfaces of the grooves and removing such initial insulating film to expose surfaces of the grooves, the grooves thereby being provided with rounded-off corners, and then sequentially forming an insulating layer and then a conductive layer on the surfaces of the grooves. Structure including the groove, with rounded-off corners, in the semiconductor substrate, the insulating layer on surfaces of the groove and the conductive layer on the insulating layer can be used as a vertically-formed data storage capacitance element, connected in series with a switching element, of a memory cell of a DRAM.

27 Claims, 7 Drawing Sheets

SEMICONDUCTOR INTEGRATED CIRCUIT DEVICE AND METHOD OF PRODUCTION THEREOF

This application is a continuation application of application Ser. No. 06/709,670, filed Mar. 8, 1985, now abandoned.

BACKGROUND OF THE INVENTION

This invention relates to a technique which is effective when applied to a semiconductor integrated circuit device. more particularly, the present invention relates to a technique which is effective when applied to a semiconductor integrated circuit device provided with small holes or grooves (e.g., moats, or trenches, formed in the substrate surface).

In order to increase memory capacity, the integration density of a semiconductor integrated circuit device equipped with a dynamic random-access memory (hereinafter called "DRAM") using series circuits of a data storage capacitance element and a switching element as memory cells tends to increase.

There has previously been proposed a technique of improving the integration density of a DRAM by forming small holes or grooves (e.g., moats or trenches) in a main surface of a semiconductor substrate by anisotropic etching, and providing an insulating film along the surface within each moat or trench and a conductive layer over the moat or trench to form a vertical data storage capacitance element, and thus reduce the plan area of each memory cell (Japanese Patent Publication No. 12739/1983).

As a result of experiments and studies on this prior technique, however, the inventor has discovered that, since the corners of the small moats or trenches, produced by anisotropic etching, have an acute-angled shape, reductions in the thickness of the insulating film and the electric field concentration are likely to occur at the corners, so that the electrostatic destruction voltage (dielectric breakdown voltage) of the insulating film of each data storage capacitance element drops markedly.

The results of experiments carried out by the present inventor has revealed that the electrostatic destruction voltage of the insulating film of a vertically-formed data storage capacitance element is only about 50 to 60% of the electrostatic destruction voltage of the insulating film of a flat (horizontal) data storage capacitance element.

If the electrostatic destruction voltage of the insulating film of a data storage capacitance element drops, it is very likely that short-circuits will occur between the semiconductor substrate, which is held at a predetermined potential, and a conductive layer which is held at a different potential. If a short-circuit occurs, the charge stored as data will be lost, and hence the electrical reliability of the DRAM will deteriorate.

SUMMARY OF THE INVENTION

It is therefore an object of the present invention to improve the electrical reliability of a semiconductor device, in particular a semiconductor integrated circuit device.

It is another object of the present invention to provide an improvement in the electrostatic destruction voltage of an insulating film in a semiconductor integrated circuit device provided with small trenches or moats (holes or grooves) formed in a main surface of a semiconductor substrate, the insulating film being provided along the surface within the small trench or moat (hole or groove), and a conductive layer being formed over the insulating film.

It is a fourth object of the present invention to provide an improvement in the electrostatic destruction voltage of an insulating film and the prevention of the loss of charge stored as data in a DRAM provided with memory cells each consisting of a data storage capacitance element consisting, in turn, of a small trench or moat (hole or groove) formed in a main surface of a semiconductor substrate, an insulating film arranged along the surface within the small trench or moat (hole or groove), and a conductive layer arranged over the insulating film, and a switching element connected in series with the data storage capacitance element.

These and other objects and novel features of the present invention will become more apparent from the following description taken in conjunction with the accompanying drawings. In the following description and claims, the "trench" as described includes, e.g., holes, grooves, moats, trenches, etc., formed in the semiconductor substrate and, in general, refers to any opening formed in the semiconductor substrate and having, e.g., acute-angled corners, and being usable for purposes of the present invention.

Although the present invention is not limited thereto, the following briefly illustrates a typical example of the invention disclosed in this application.

A silicon nitride film and an etching mask are sequentially formed over a main surface of a semiconductor substrate, and the silicon nitride film and the semiconductor substrate are then selectively etched using the etching mask, to form a heat-resistant treatment mask and a small trench in the semiconductor substrate. Thereafter, an insulating film is formed along the surface within the small trench, using the heat-resistant treatment mask, and is then removed selectively to form a small trench whose sharp corners (acute-angled corners) are smoothed (rounded off).

Thus, generally, the present invention provides for trenches, in the semiconductor substrate, wherein the corners thereof are rounded off, e.g., curved. Since the reduction in the thickness of the insulating film at the corners and the field concentration at these portions can be restricted by forming the insulating film and a conductive layer in a small trench whose sharp corners have been smoothed (rounded off), in the way described above, for example, the electrostatic destruction voltage of the insulating film can be improved.

DETAILED DESCRIPTION OF THE INVENTION

Figure 1:
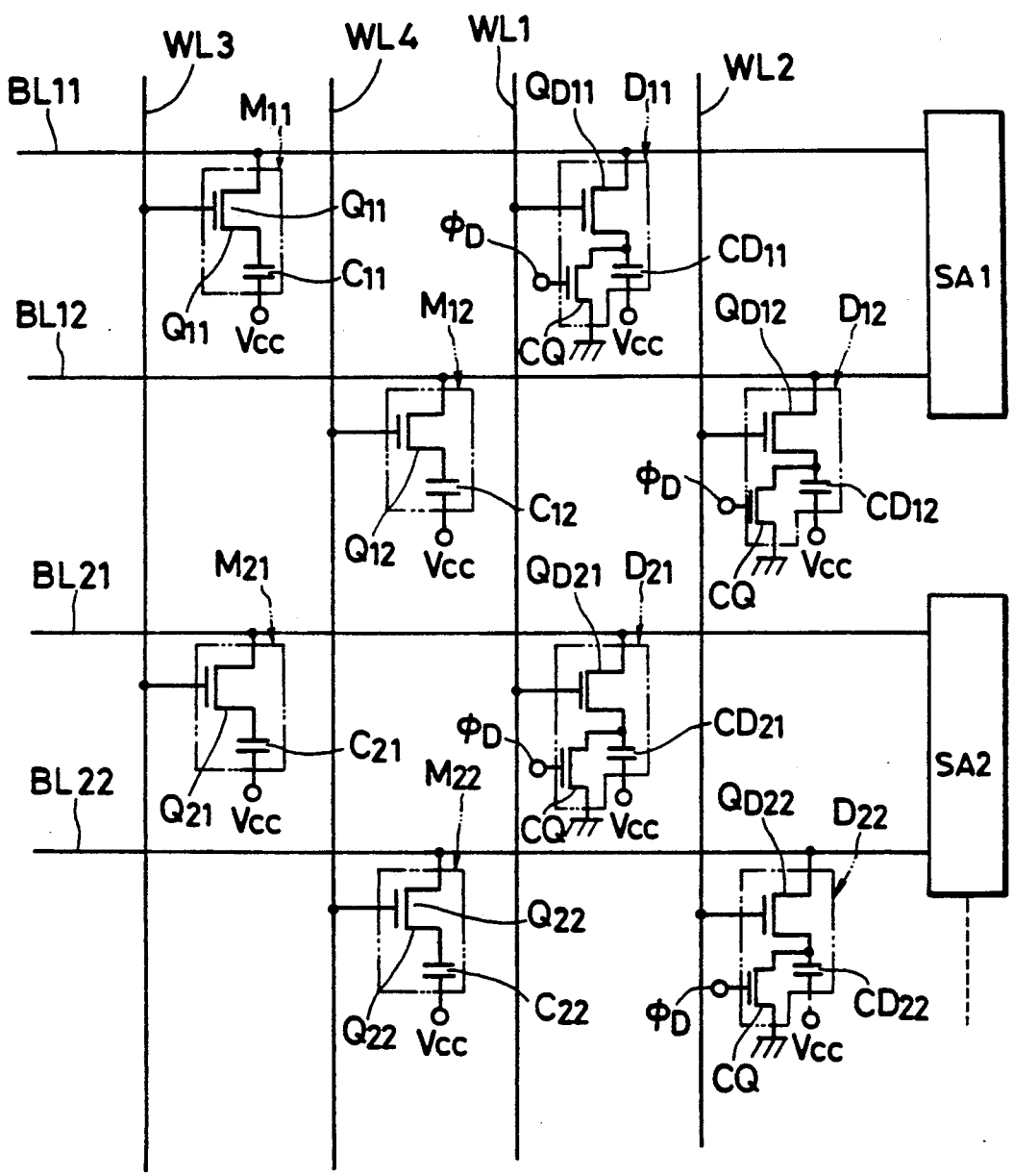
FIG. 1 is an equivalent circuit diagram of principal portions of a memory cell array of a DRAM, which is useful for illustrating an embodiment of the present invention.

Hereinafter, the construction of the present invention will be described with reference to embodiments thereof.

The same reference numerals are used to identify similar constituents throughout the drawings, and a repetition of the description of such constituents will be omitted.

FIG. 1 is an equivalent circuit diagram of principal portions of a memory cell array of a DRAM, and is useful for illustrating embodiments of the invention.

In this drawing, symbols SA1, SA2 . . . denote sense amplifiers which each amplify a minute potential difference between a predetermined memory cell and a predetermined dummy cell, which will be described later BL11, BL12 denote bit lines extending from one end of the sense amplifier SA1 in the row direction, and BL21, BL22 denote bit lines extending from one end of the sense amplifier SA2 in the row direction. These bit lines transmit charge as data.

WL1, WL2 denote word lines that extend in the column direction and are connected to predetermined gate electrodes constituting switching MISFETs of the dummy cells, and which turn on and off each MISFET.

WL3, WL4 denote word lines that extend in the column direction and are connected to predetermined gate electrodes constituting switching MISFETs of the memory cells, and which turn on and off each MISFET.

M11, M12, M21, M22 . . . denote memory cells that hold charge acting as data.

Each memory cell M11, M12, M21, M22 . . . consists of a MISFET Q11, Q12, Q21, Q22 . . . of which one end is connected to a predetermined bit line BL, and a gate electrode thereof is connected to a predetermined word line WL, and a data storage capacitance element C11, C12, C21, C22 . . . of which one end is connected to the other end of the corresponding MISFET Q11, Q12, Q21, Q22 . . . , and the other end thereof is connected to a fixed potential $V_{cc}$ terminal at, for instance, power source potential (5 V), or the like.

D11, D12, D21, D22 . . . denote dummy cells that hold a charge which can detect logic "1" and "0" used as data in the memory cells M.

Each dummy cell D11, D12, D21, D22 . . . consists of a MISFET QD11, QD12, QD21, QD22 . . . of which one end is connected to a predetermined bit line, and whose gate electrode is connected to a predetermined word line WL, a data-detecting capacitance element CD11, CD12, CD21, CD22 . . . of which one end is connected to the other end of the corresponding MISFET QD11, QD12, QD21, QD22 . . . and whose other end is connected to the fixed potential $V_{cc}$ terminal at, for instance, power source potential or the like, and a clear MISFET CQ for clearing the charge stored in the data-detecting capacitance element CD11, CD12, CD21, CD22 . . . .

ØD denotes a terminal which is connected to the gate electrode of the clear MISFET CQ.

The specific constructions of this embodiment will now be described.

Figure 2:
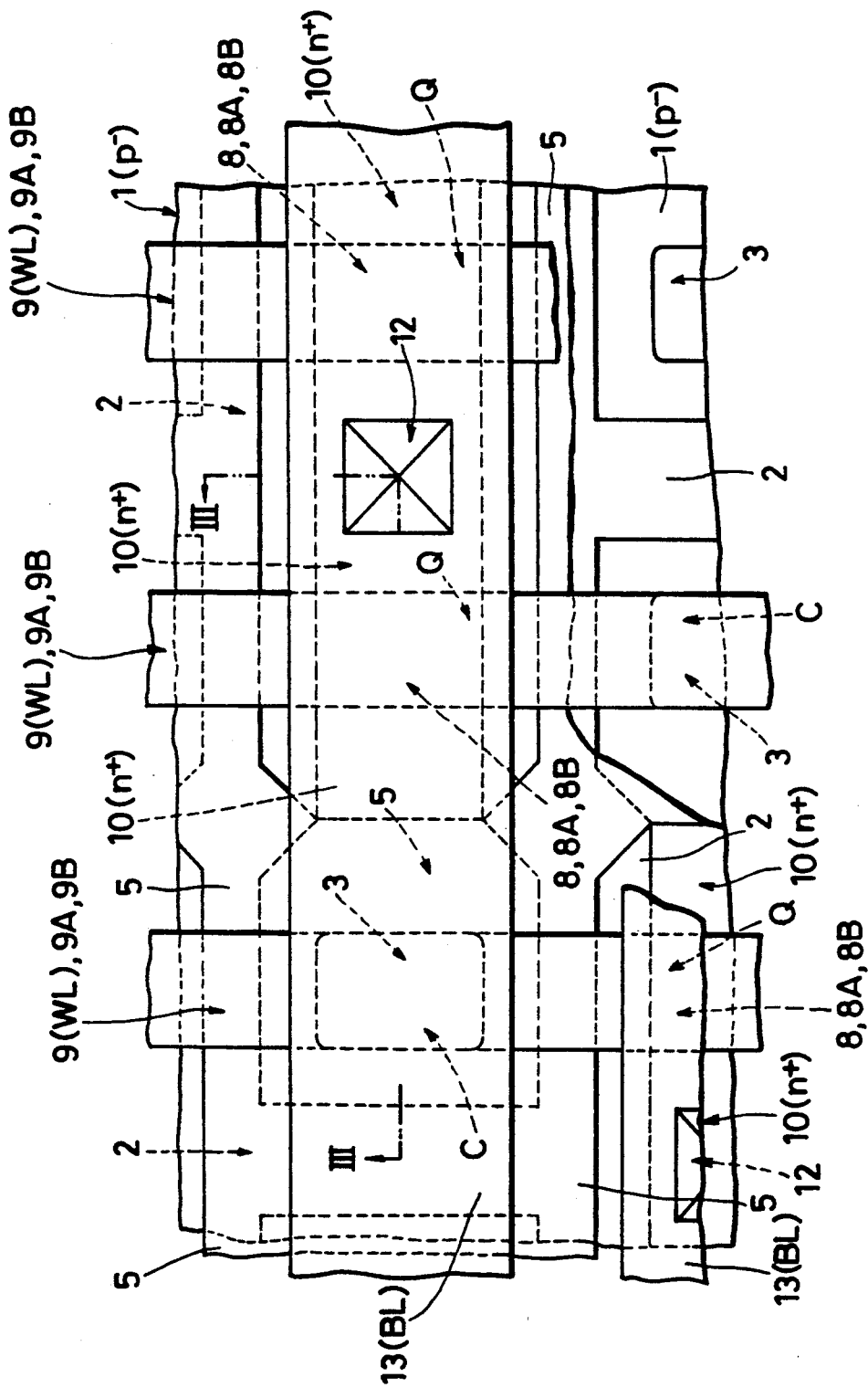
FIG. 2 is a plan view of principal portions of a memory cell array of a DRAM, which is useful for illustrating the structure of an embodiment of the invention.
Figure 3:
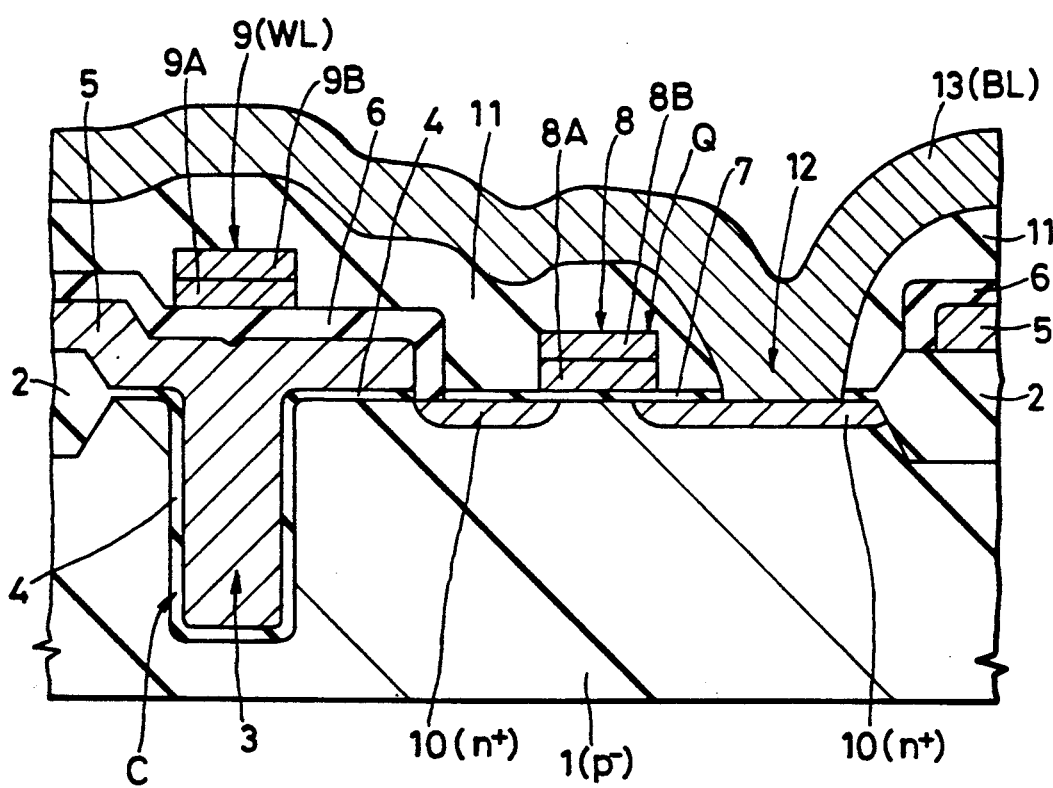
FIG. 3 is a section taken along the line III—III of FIG. 2.

FIG. 2 is a plan view of principal portions of the DRAM memory cell, and is useful for illustrating the construction of this embodiment, and FIG. 3 is a section taken along the line III—III of FIG. 2.

In FIG. 2, the insulating layer provided between conductive layers is not shown in order to simplify the diagram.

In FIGS. 2 and 3, reference numeral 1 denotes a p⁻-type semiconductor substrate made of single-crystal silicon, which will constitute the DRAM.

Reference numeral 2 denotes a field-insulating film (device-separation insulating film) formed on the main surface of the semiconductor substrate 1 in such a manner that it is positioned between a predetermined memory cell and peripheral circuits (not shown) such as semiconductor element-forming regions (active regions) of an address select circuit, a read circuit, a write circuit, etc., known in the art. The insulating film 2 isolates these semiconductor element-forming regions from one another.

The memory cells of the DRAM are surrounded and defined by the field insulating film 2 which defines a pair of patterns that repeat in the direction in which bit lines extend.

Reference numeral 3 denotes a small trench formed (e.g., etched, bored, etc.) in the main surface of the semiconductor substrate 1 within the region in which the data storage capacitance element is to be formed, so as to extend inward from the main surface of the element region, this small trench constituting part of the data storage capacitance element. The small trench 3 forms a three-dimensional data storage capacitance element, to reduce the plan area needed for the formation of the data storage capacitance element and to improve the integration density of the DRAM.

The acute-angled shape of all the corners of the small trench 3 is smoothed (rounded off) to a predetermined shape.

Reference numeral 4 denotes an insulating film which is formed over the main surface of the semiconductor substrate 1 in the data storage capacitance element region, at least along the surface within the small trench 3. This insulating film 4 will constitute part of an MIS data storage capacitance element. Since the acute-angled shape of the corners of the small trench 3 has been smoothed, no marked reduction in the film thickness of the insulating film 4, e.g., at the corners, occurs.

Reference numeral 5 denotes a conductive plate which is positioned over the insulating film 4 and is electrically connected to other conductive plates adjacent thereto. The conductive plate 5 will constitute part of the MIS data storage capacitance element. The conductive plate 5 consists of, e.g., a doped polycrystalline silicon layer, for example, and is formed by a conductive layer-forming step as the first layer in the production process.

The data storage capacitance element C of each memory cell of the DRAM consists primarily of the semiconductor substrate 1, the small trench 3, the insulating film 4, and the conductive plate 5. When the conductive plate 5 is connected to a potential of about 5 V, for example, the data storage capacitance element C defines a depletion layer extending inward from the main surface of the semiconductor substrate 1, and stores as data a charge that is transmitted from the bit lines to the depletion layer through a switching element.

Since the sharp corners of the small trench are smoothed, the marked reductions in the film thickness of the insulating film 4 and the electric field concentration at the corners can be restricted. Accordingly, the electrostatic destruction voltage of the insulating film 4 is improved, and no short-circuits between the semiconductor substrate 1 and the conductive plate 5 occur, so that the charge stored as data in the data storage capacitance element does not disappear.

Reference numeral 6 denotes an insulating film that is arranged in such a manner that it covers the conductive plate 5 and electrically isolates the plate from a word line which will be formed on the insulating film.

Reference numeral 7 denotes an insulating film that is formed over the main surface of the semiconductor substrate 1 in a switching element region, this insulating film 7 primarily constituting the gate insulating film of the MISFET.

Reference numeral 8 denotes a conductive layer that is formed over the insulating film 7, and which constitutes the gate electrode of the MISFET.

Reference numeral 9 denotes a conductive layer that is electrically connected to, and integrated with, the conductive layer 8 in the column directions, so as to extend over the insulating film 6. This conductive layer will constitute a word line WL.

In order to reduce resistance and improve the data read and write speeds, the conductive layers 8 and 9 are formed by depositing metal layers having a high melting point (e.g., refractory metals), or layers of a compound between a high melting point metal and silicon (e.g., a silicide), onto the polycrystalline silicon layers 8A and 9A, respectively. They are formed by a second conductive layer-forming step in the production process. It is possible to use molybdenum, tungsten, titanium, tantalum, or the like as the high melting point metal, or a silicide of one of those metals.

Reference numeral 10 denotes $n^+$-type semiconductor regions that are formed in the semiconductor substrate, extending to the main surface of the semiconductor substrate 1 on either side of the conductive layer 8. These regions are used as source and drain regions, and constitute part of the MISFET.

A MISFET Q acting as the switching element of the memory cell of a DRAM consists primarily of the semiconductor substrate 1, the conductive layer 8, the insulating film 7, and a pair of semiconductor regions 10.

Each memory cell includes a data storage capacitance element and a MISFET Q.

Reference numeral 11 denotes an insulating film that is positioned in such a manner that it covers the conductive layers 8 and 9, and isolates them electrically from a bit line which will be formed thereon. A phosphosilicate glass film, which can be subjected to glass flow, can be used as the insulating film 11.

Reference numeral 12 denotes a contact hole formed by selectively removing the insulating films 7 and 11 over the semiconductor region 10, which provides an electrical connection with the bit line which will be disposed on the insulating film 11.

Reference numeral 13 denotes a conductive layer that is electrically connected to the semiconductor region 10 through the contact hole 12, and extends in the row direction over the insulating film 11. This layer constitutes the bit line BL. The conductive layer 13 consists of, for example, an aluminum layer, and is formed by a third conductive layer-forming step in the production process.

Specific details of the production method of this embodiment of this invention will now be given.

FIGS. 4 through 9 are sections through principal portions of the data storage capacitance element of a memory cell of a DRAM at each production step, and are useful for illustrating the production method of this embodiment First of all, a $p^-$-type semiconductor substrate 1 is prepared. An insulating film 2A is formed over one main surface of the semiconductor substrate in a region thereof in which the semiconductor elements will be formed, and a field-insulating film 2 is formed over the portions of the substrate 1 other than the semiconductor element region.

Figure 4:
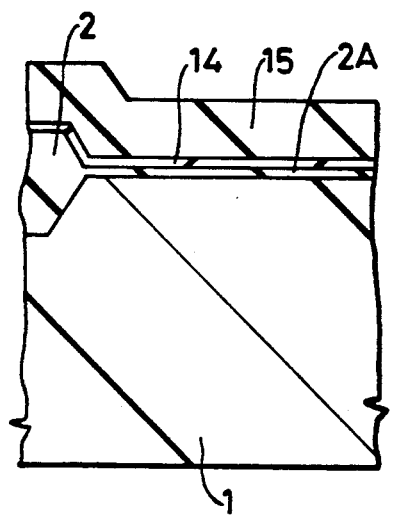
FIGS. 4 through 9 are sections through principal portions of a data storage capacitance element of a DRAM memory cell at each production step, which are useful for illustrating a method of producing an embodiment of the present invention.

Mask-forming materials 14 and 15 are sequentially deposited onto the insulating film 2A and the field-insulating film 2, respectively, as shown in FIG. 4, for the formation of a small trench. A phosphosilicate glass film formed by chemical vapor deposition (hereinafter called "CVD"), for example, is used as the mask-forming material 15 acting as an etching mask for the formation of the small trench, and the film thickness can range from about 0.8 to about 1.2 $\mu$m, for example. A silicon nitride film formed by CVD, for example, is used as the mask-forming material 14 for the mask used to smooth the sharp corners of the small trench its thickness being about 0.04 to 0.06 $\mu$m, for example.

Figure 5:
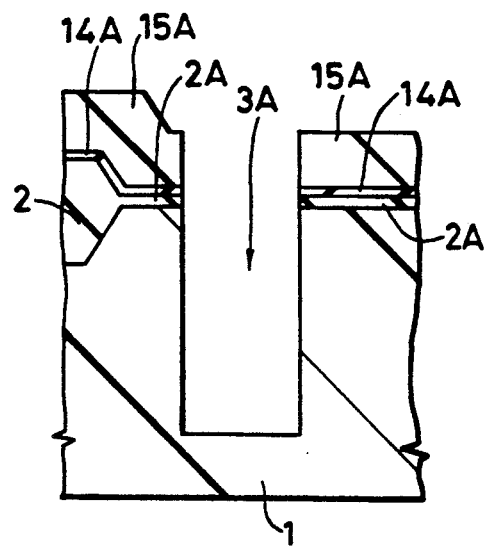

After the step shown in FIG. 4, the mask-forming material 15 of the small-trench region within the data storage capacitance element region is selectively removed by dry etching utilizing $CHF_3$ gas, to form a mask 15A resistant to etching. The mask-forming material 14, the insulating film 2A, and the semiconductor substrate 1 are then removed selectively using mainly the mask 15A, to form the small trench 3A in the main surface of the semiconductor substrate 1, as shown in FIG. 5. A mask 14A for a heat-resistant treatment is also formed by substantially the same process of forming small trench 3A, which mask 14A is self-aligned aligned with the small trench 3A. The small trench 3A has a size of about 1.0×1.5 $\mu m^2$, for example, and is formed by anisotropic (dry) etching utilizing $CHF_3$ gas in order to minimize the plan area of the data storage capacitance element. It has a depth of about 4.0 to 6.0 $\mu$m, extending inward from the main surface of the semiconductor substrate 1. Since the small trench 3A is formed by anisotropic etching, its corners have an acute-angled shape.

Figure 6:
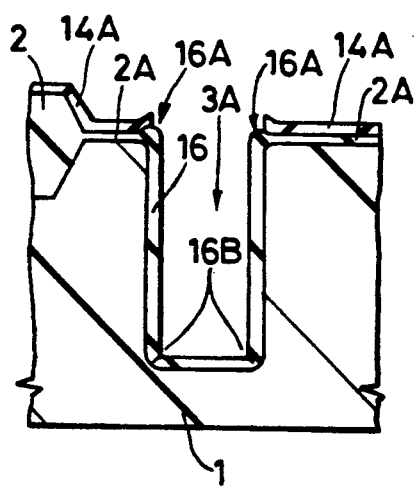

After the step shown in FIG. 5, the mask 15A is removed to expose the mask 14A. Using this mask 14A, an insulating film 16 is formed over the main surface of the semiconductor substrate 1 along the surface within the small trench 3A, in order to smooth the sharp corners of the small trench 3A, as shown in FIG. 6. The insulating film 16 consists of, for example, a silicon oxide film formed by thermal oxidation (e.g., $SiO_2$), and its thickness is about 0.03 to 0.20 $\mu$m.

The thickness of the insulating film 16 drops markedly at sharp corners 16B at the bottom of the small trench 3A and increases at sharp corners 16A at the mouth of the small trench 3A, so that it is formed non-uniformly overall. However, the sharp corners 16A and 16B in the main surface of the semiconductor substrate 1 below the insulating film 16 are smoothed, so that an arc shape is provided thereat (e.g., the corners are rounded off). Thus, in the present embodiment, the forming of the insulating film 16, using the semiconductor substrate for the formation thereof, acts to round off the corners.

Figure 7:
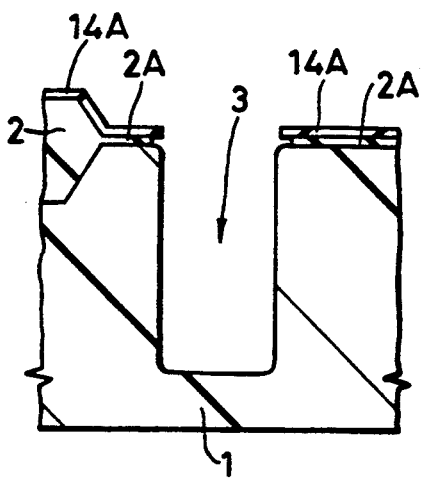

After the step shown in FIG. 6, the insulating film 16 is selectively removed by conventional wet etching using the mask 14A as an etching mask, and the small trench 3 those sharp corners have been smoothed is formed as shown in FIG. 7.

The steps of forming and removing the insulating film 16 do not exert any adverse effect on the other portions, such as changing the thickness of the field insulating film 2, because the mask 14A is provided.

As will be described later, the inventor of this invention has confirmed that the small trench 3 whose sharp corners have been smoothed to an arc shape of radius of at least, e.g., 0.03 μm in this embodiment ensures that the insulating film of a data storage capacitance element which is formed three-dimensionally therein can provide an electrostatic destruction voltage of about 70 to 90% that of a flat film.

Figure 8:
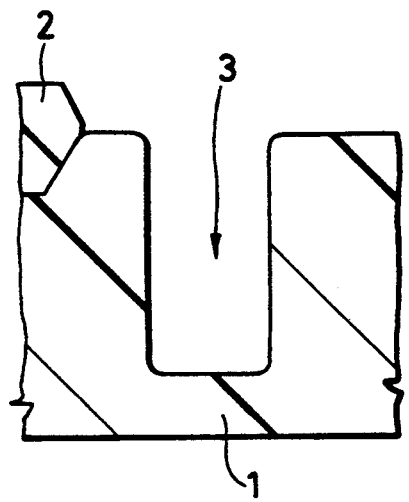

After the step shown in FIG. 7, the mask 14A and the insulating film 2A are removed, as done conventionally for removing, e.g., silicon nitride and silicon oxide films, to expose the main surface of the semiconductor substrate, as shown in FIG. 8.

Figure 9:
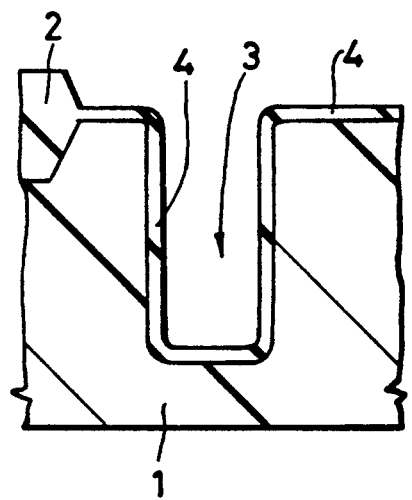

After the step shown in FIG. 8, an insulating film 4 is formed over the exposed main surface of the semiconductor substrate 1, as shown in FIG. 9. In order to form the insulating film of the data storage capacitance element, the insulating film 4 can be a silicon oxide film (e.g., SiO$_2$) formed by thermal oxidation, for example, and its film thickness can be about 0.01 to 0.03 μm. In order to increase its dielectric constant and store a greater quantity of charge as data, the insulating film 4 may consist of an approximately 0.01 μm thick silicon oxide film (e.g., SiO$_2$) formed by thermal oxidation, and an approximately 0.02 μm thick silicon nitride film deposited by CVD on the silicon oxide film, for example.

Since the sharp angles at the corners are smoothed, the insulating film 4 is formed over the main surface of the semiconductor substrate 1, and along the surface within the small trench 3, at a substantially uniform thickness.

Thereafter, standard production steps are used to complete the DRAM of this embodiment shown in FIGS. 2 and 3.

The effect of this embodiment will now be described.

Figure 10:
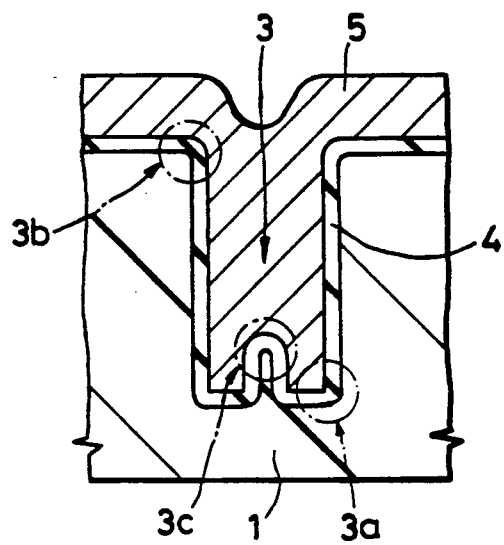
FIG. 10 is a section through principal portions of a DRAM memory cell provided as a model for measuring the dielectric breakdown voltage of an insulating film of a data storage capacitance element utilizing a small trench.
Figure 11:
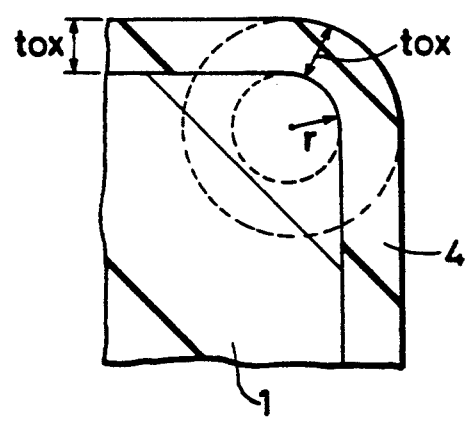
FIG. 11 is an enlarged section through a corner of the small trench of FIG. 10.
Figure 12:
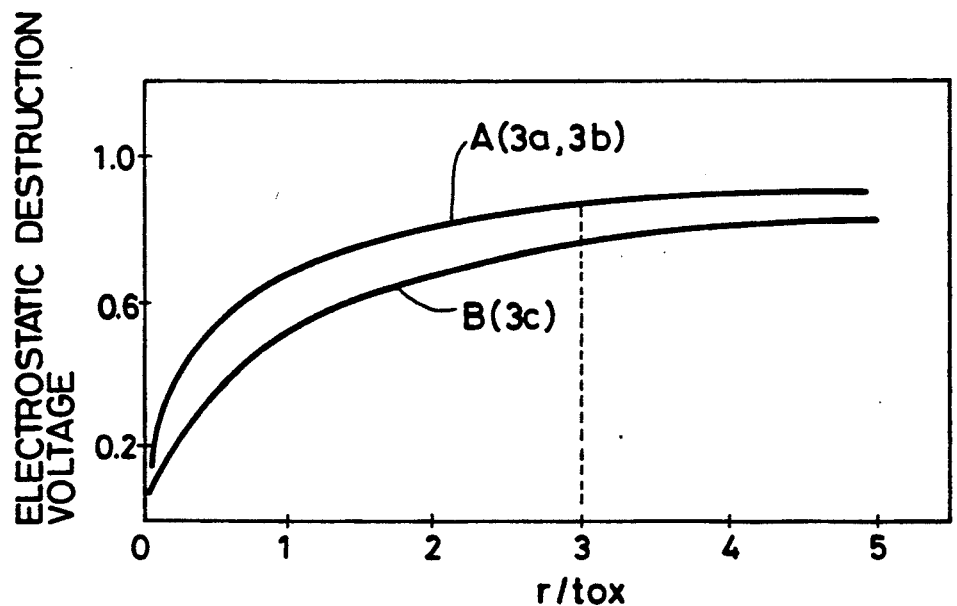
FIG. 12 is a graph of the results of calculations on the electrostatic destruction voltage of an insulating film, obtained using the model shown in FIGS. 10 and 11.
Figure 13:
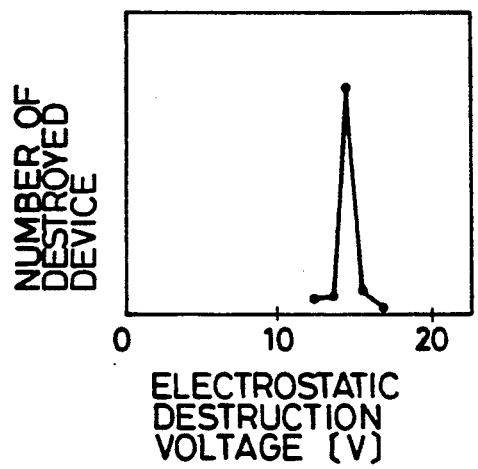
FIG. 13 is a graph of the results of experiments on the electrostatic destruction voltage of an insulating film when the present invention is not applied.
Figure 14:
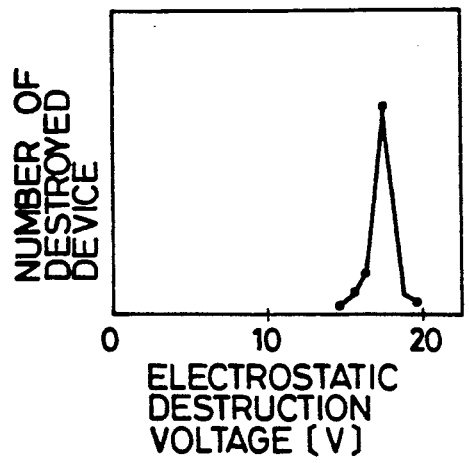
FIGS. 14 through 16 are graphs of the results of experiments on the electrostatic destruction voltage of an insulating film when the present invention is applied.
Figure 15:
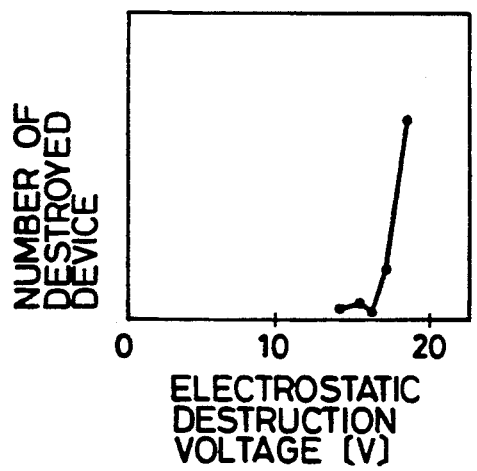
Figure 16:
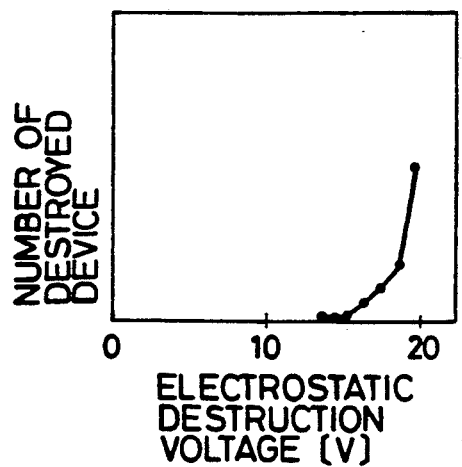

FIG. 10 is a section through principal portions of the DRAM memory cell provided as a model in order to measure the electrostatic destruction voltage of the insulating film of a data storage capacitance element utilizing a small trench; FIG. 11 is an enlarged section through a corner of the small trench in FIG. 10; FIG. 12 is a graph of the results of calculations of the electrostatic destruction voltage of the insulating film, obtained by using the model shown in FIGS. 10 and 11; FIG. 13 is a graph of the results of experiments on the electrostatic destruction voltage of an insulating film when the present invention is not applied; and FIGS. 14 through 16 are graphs of the results of experiments on the electrostatic destruction voltage of an insulating film when the present invention is applied.

In FIGS. 10 and 11, reference numerals 3a and 3b denote portions whose sharp angles have been smoothed to a cylindrical shape, and 3c is a portion at which a projection, formed by the effect of foreign matter in the step of forming the small trench 3A, is smoothed to a spherical shape.

Symbol $t_{ox}$ denotes the thickness of the insulating film 4, and r denotes the radius of the arc formed at the corner of the small trench 3.

In FIG. 12, the ratio of the radius r to the thickness $t_{ox}$ of the insulating film 4 ($r/t_{ox}$) is shown along the axis of the abscissa, and the electrostatic destruction voltage of the insulating film 4 at the small trench 3, when the electrostatic destruction voltage of the insulating film 4 is 1.0 at a planar surface portion, is shown along the axis of the ordinate.

Data A shows the electrostatic destruction voltage of the insulating film 4 at the portions 3a and 3b shaped into the cylindrical form, and data B shows the electrostatic destruction voltage of the insulating film 4 at the portion 3c shaped into the spherical form.

As can be seen clearly from FIGS. 10 through 12, the breakdown voltage of the insulating film 4 can be improved to about 70 to 90% of the flat-portion value by smoothing the sharp corners of the small trench 3 to a radius which is at least three times the thickness $t_{ox}$ of the insulating film 4.

If the thickness $t_{ox}$ of the insulating film 4 is about 0.01 μm, for example, the radius r is to be about 0.03 μm to achieve the above-described results. Therefore, if the insulating film 16 is formed about 0.03 μm thick, the radius r can be about 0.03 μm, and a electrostatic destruction voltage of about 70 to 90% of the flat-portion value can be obtained for the insulating layer 4. The thickness of insulating film 16 can be, e.g., at least 0.03 μm.

In FIGS. 13 through 16, the electrostatic destruction voltage (V) of the insulating film 4 is shown along the axis of the abscissa, and the number of devices which are destroyed when the voltage shown in the abscissa is applied between the substrate 1 and electrode 5 is shown along the axis of the ordinate.

FIG. 13 shows the electrostatic destruction voltage when the insulating film 4 is formed directly over the surface of a small trench 3A whose sharp corners have not been smoothed FIG. 14 shows the electrostatic destruction voltage when the insulating film 4 is formed over the surface of a small trench 3 whose sharp corners have been smoothed by the formation of an about 0.05 μm thick insulating film 16.

FIG. 15 shows the electrostatic destruction voltage when the insulating film 4 is formed over the surface of a small trench 3 whose sharp corners have been smoothed by the formation of an about 0.10 μm thick insulating film 16.

FIG. 16 shows the electrostatic destruction voltage when the insulating film 4 is formed over the surface of a small trench 3 whose sharp corners have been smoothed by the formation of an about 0.20 μm thick insulating film 16.

In all these cases, the thickness $t_{ox}$ of the insulating film 4 is 0.02 μm.

As can be seen clearly from FIGS. 13 through 16, the formation of a data storage capacitance element in a small trench 3 whose sharp corners have been smoothed can improve the electrostatic destruction voltage of the insulating film by at least about 20%, compared to the case in which the corners are not smoothed.

As described above, the technical means disclosed in the resent application can provide the following effects.

(1) A small trench whose sharp corners have been smoothed (rounded off) can be formed by forming (etching or boring) a small trench in the main surface of a semiconductor substrate so as to extend inward from the main surface, forming an insulating film along the surface of the small trench, and then selectively removing the insulating film.

(2) Since a small trench whose sharp corners have been smoothed can be obtained by the effect described in (1) above, the marked reductions in the thickness of the insulating film, and the electric field concentration at the corners of the small trench can be restricted; and in a semiconductor device including the small trench, the insulating film provided over the main surface of the semiconductor substrate and along the surface within the small trench, and a conductive layer formed over the insulating film, the electrostatic destruction voltage of the insulating film can be improved.

3) Since a small trench whose sharp corners have been smoothed can be obtained by the effect described in (1) above, marked reductions in the thickness of the insulating film and the electric field concentration at the corners of the small trench, can be restricted in a data storage capacitance element of a memory cell of a DRAM including the small trench; in a DRAM including the insulating film provided over the main surface of the semiconductor substrate and along the surface within the small trench, and a conductive layer formed over the insulating film, the electrostatic destruction voltage of the insulating film can be improved, and the loss of the charge stored as data can be prevented.

(4) Since the marked reductions in the thickness of the insulating film and the electric field concentration at the corners of a small trench can be restricted, and the electrostatic destruction voltage of the insulating film can be improved, in a semiconductor device utilizing a small trench as described in (2) above, the electrical reliability of the semiconductor integrated circuit device can be improved.

(5) Since the marked reductions in the thickness of the insulating film and the electric field concentration at the corners of a small trench can be restricted, and the electrostatic destruction voltage can be improved, in a data storage capacitance element of a DRAM memory cell utilizing a small trench, and, moreover, since the loss of the charge stored as data can be prevented as described in (3) above, the electrical reliability of the DRAM can be improved.

Although the present invention has been described above with specific reference to an embodiment thereof, the invention is not particularly limited to that embodiment, but can of course be modified in various ways without departing from the scope of and spirit thereof.

For instance, the embodiment illustrates an example in which the present invention is applied to a data storage capacitance element of a DRAM memory cell utilizing a small trench, but it is not specifically limited thereto, and can be applied to a capacitance element of a semiconductor integrated circuit device utilizing a small trench.

While I have shown and described an embodiment in accordance with the present invention, it is understood that the same is not limited thereto, but is susceptible of numerous changes and modifications as known to those skilled in the art, and I, therefore, do not wish to be limited to the details shown and described herein, but intend to cover all such changes and modifications as are encompassed by the scope of the appended claims.

What is claimed is:

1. A method of producing a semiconductor device including the steps of forming a trench in a main surface of a semiconductor substrate by dry etching such that said trench extends from said main surface into the interior of said semiconductor substrate, said trench having a mouth at the main surface of the trench and a bottom in the interior, whereby said trench includes corners at the bottom and at the main surface; forming an initial insulating film, of an oxide, along the surface within said trench, including at said corners at the bottom and at the main surface, by thermal oxidation and selectively removing said initial insulating film by wet etching, so as to simultaneously round off said corners at the bottom and at the main surface, wherein the corners are rounded off to have a radius of at least three times the thickness of a further insulating film formed along the surface within the trench; forming the further insulating film along the surface within said trench; and forming a conductive layer over said further insulating film.

2. A method of producing a semiconductor device as defined in claim 1, wherein said semiconductor substrate is a silicon single crystal.

3. A method of producing a semiconductor device as defined in claim 2, wherein the trench is formed by anisotropically etching the semiconductor substrate, whereby a trench having acute corners are formed.

4. A method of producing a semiconductor device as defined in claim 2, wherein said initial insulating film is formed to have a thickness of at least 0.03 $\mu$m.

5. A method of producing a semiconductor device as defined in claim 1, wherein said initial insulating film has a thickness of 0.03 to 0.20 $\mu$m.

6. A method of producing a semiconductor device as defined in claim 1, wherein the corners are rounded off to have a radius of at least 0.03 $\mu$m.

7. A method of producing a semiconductor device as defined in claim 1, wherein said further insulating film comprises a first layer, of silicon oxide, formed adjacent the surface within the trench, and a second layer, of silicon nitride, adjacent the first layer.

8. A method of producing a semiconductor device as defined in claim 1, wherein said conductive layer is a polycrystalline silicon layer.

9. A method of producing a semiconductor device as defined in claim 1, wherein said dry etching to form the trench is an anisotropic dry etching.

10. A method of producing a semiconductor device as defined in claim 1, wherein the further insulating film and conductive layer formed thereover provide a data storage capacitance element of a dynamic random access memory.

11. A method of producing a semiconductor device as defined in claim 1, wherein the step of forming the trench includes the sub-steps of forming an oxidation-resistance layer on the main surface of the semiconductor substrate; removing a portion of said oxidation-resistant layer at the location where the trench is to be formed, leaving a remaining portion of the oxidation-resistant layer; and performing said dry etching so as to form said trench.

12. A method of producing a semiconductor device as defined in claim 11, wherein said remaining portion of said oxidation-resistant layer is retained on said main surface of said semiconductor substrate during said forming an initial insulating film, whereby oxidation of the main surface of the semiconductor substrate when forming the initial insulating film is avoided.

13. A method of producing a semiconductor device as defined in claim 12, wherein said removing a portion of the oxidation-resistant layer and said dry etching so as to form said trench are performed using the same mask, whereby said remaining portion of the oxidation-resistant layer is formed in self-alignment with said trench.

14. A method of producing a semiconductor device as defined in claim 1, wherein said forming an initial insulating film along the surface within the trench is performed with an oxidation-resistant layer on said main surface of said semiconductor substrate, whereby oxidation of the main surface of the semiconductor substrate when forming the initial insulating film is avoided.

15. A method of producing a semiconductor device including the steps of forming a trench in a main surface of a semiconductor substrate by dry etching such that said trench extends from said main surface into the interior of said semiconductor substrate, said trench having a mouth at the main surface of the substrate and a bottom in the interior, whereby said trench has corners at said bottom and at said main surface, said forming the trench including forming a mask on the substrate surface, said mask having an opening at the location of the trench, and forming the trench utilizing said mask; forming an initial insulating film, of an oxide, along the surface within the trench, including at said corners at said bottom and at said main surface, by thermal oxidation, using said mask, and selectively removing said initial insulating film along the surface within the trench by wet etching, so as to simultaneously round off said corners at the bottom and at the main surface, wherein said corners are rounded off to have a radius of at least three times the thickness of an insulating film formed over the main surface of the semiconductor substrate and along the surface within the trench; forming the insulating film over said main surface of said semiconductor substrate and along the surface within said trench; and forming a conductive layer over said insulating film.

16. A method of producing a semiconductor device as defined in claim 15, wherein said trench is formed by etching and said initial insulating film is formed by thermal oxidation, and further wherein said mask is formed of materials resistant to the etching used in said etching and resistant to said thermal oxidation.

17. A method of producing a semiconductor device as defined in claim 16, wherein said mask includes two layers, a first layer of material resistant to said etching and a second layer of material resistant to said thermal oxidation.

18. A method of producing a semiconductor device as defined in claim 17, wherein said first layer is made of phosphosilicate glass and said second layer is made of silicon nitride.

19. A method of producing a semiconductor device as defined in claim 15, wherein said insulating film has a substantially uniform thickness.

20. A method of producing a semiconductor device as defined in claim 15, wherein the insulating film and conductive layer formed thereover provide a data storage capacitance element of a dynamic random access memory.

21. A method of producing a semiconductor device as defined in claim 15, wherein said dry etching to form the trench is an anisotropic dry etching.

22. A method of producing a semiconductor device having a plurality of memory cells, each memory cell comprising a data storage capacitances element and a switching MISFET connected in series, said data storage capacitance element including a trench, including the steps of:
  forming said trench extending from a main surface of a semiconductor substrate, into the interior thereof, by anisotropically etching said semiconductor substrate, said trench having a mouth at the main surface of the substrate and a bottom in the interior, whereby said trench has corners at said bottom and at the main surface of the semiconductor substrate;
  forming an initial insulating film, of an oxide, along the surface within the trench, including at said corners at said bottom and at the main surface, by thermal oxidation;
  removing said initial insulating film from said surface within the trench so as to simultaneously round off the corners at said bottom and at the main surface of the semiconductor substrate, wherein said corners are rounded off to have a radius of at least three times the thickness of a further insulating film formed over the main surface of the semiconductor substrate and along the surface within the trench;
  forming the further insulating film along the surface of said semiconductor substrate, including along the surface within the trench; and
  forming a conductive layer over said further insulating film.

23. A method of producing a semiconductor device as defined in claim 22, wherein said further insulating film has a substantially uniform thickness.

24. A method of producing a semiconductor device as defined in claim 22, wherein said initial insulating film has a thickness of 0.03 to 0.2 μm.

25. A method of producing a semiconductor device as defined in claim 22, wherein said conductive layer is a polycrystalline silicon layer.

26. A method of producing a semiconductor device as defined in claim 22, wherein the anisotropic etching to form said trench is an anisotropic dry etching.

27. A method of producing a semiconductor device as defined in claim 22, wherein said data storage capacitance element is a data storage capacitance element of a dynamic random access memory.

* * * * *